July 28, 1964 C. M. WINE ETAL 3,142,766

TUNNEL DIODE BIPOLAR PULSE PAIR GENERATOR

Filed Dec. 30, 1960

INVENTORS,
CHARLES M. WINE
BY & JAMES C. MILLER

ATTORNEY

United States Patent Office 3,142,766
Patented July 28, 1964

3,142,766

TUNNEL DIODE BIPOLAR PULSE PAIR GENERATOR

Charles M. Wine, Princeton, and James C. Miller, Hamilton Square, N.J., assignors to Radio Corporation of America, a corporation of Delaware Filed Dec. 30, 1960, Ser. No. 79,852
6 Claims. (Cl. 307—88.5)

This invention relates to tunnel diode pulse circuits, and more particularly to a circuit for generating bipolar pulse pairs. The circuit of the invention is useful, for example, in very high speed electronic computer and data processing apparatus.

It is the general object of this invention to provide an improved circuit for acting in response to an input trigger pulse to generate a first very short pulse of one polarity which is immediately followed by another equally short pulse of the opposite polarity.

In one specific aspect, the invention comprises two parallel paths connected from a terminal to a point of reference potential. One of the parallel paths includes a first inductor, and the other parallel path includes, in series, two oppositely-poled tunnel diodes. The junction between the two tunnel diodes is connected through a second inductor and a source of unidirectional potential to the point of reference potential. Means are provided for applying an input pulse across the parallel circuit, and means are also provided for deriving an output bipolar pulse pair from across the parallel circuit.

The above and other objects and aspects of the invention will be apparent to those skilled in the art from the following more detailed description taken in conjunction with the appended drawings, wherein.

Figure 1:
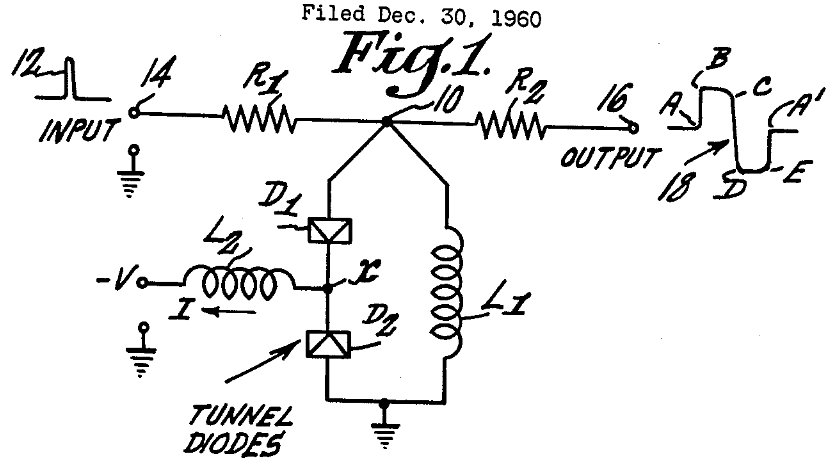
FIGURE 1 is a circuit diagram of a bipolar pulse pair generator constructed according to the teachings of the invention.

The bipolar pulse pair generator of FIGURE 1 includes a terminal 10 from which two parallel paths extend to a point of reference potential such as ground. One of the parallel paths includes an inductor $L_1$. The other parallel path includes a negative resistance diode or tunnel diode $D_1$ connected in series with another negative resistance diode or tunnel diode $D_2$, the tunnel diodes being oppositely poled so that both diodes exhibit a tunneling effect when current flows through them in the directions toward the junction point $x$ between the two diodes. An inductor $L_2$ is connected from the junction point $x$ to the $-V$ terminal of a source of unidirectional potential, as indicated, which is referenced to ground. An input trigger pulse 12 can be applied to an input terminal 14 from which it is coupled through an input resistor $R_1$ to the terminal 10. The terminal 10 is connected through an output resistor $R_2$ to an output terminal 16 where a bipolar pulse pair output signal 18 is developed in response to the input trigger pulse.

By way of illustration, to facilitate a description of the operation of the circuit, the diodes $D_1$ and $D_2$ may be similar gallium arsenide tunnel diodes having a peak current of 50 milliamperes. The diodes may have a voltage in their low voltage positive resistance region of about 0.2 volt, and a voltage in their high voltage positive resistance region of about 1 volt. The $-V$ terminal of the source of unidirectional potential provides a substantially constant voltage which may have a value somewhat less than 0.2 volt. Therefore, the quiescent bias condition is one wherein both of the diodes $D_1$ and $D_2$ are biased in their low voltage positive resistance regions near the current peaks of their current-voltage characteristic curves. Continuing the example, the inductors $L_1$ and $L_2$ may be air core inductors each consisting of two turns of wire having a diameter of about one quarter of an inch. The input trigger pulse 12 may have a duration of about 1 nanosecond (1 millimicrosecond), and each pulse of the bipolar output pulses may have a duration of about 10 nanoseconds.

Figure 2:
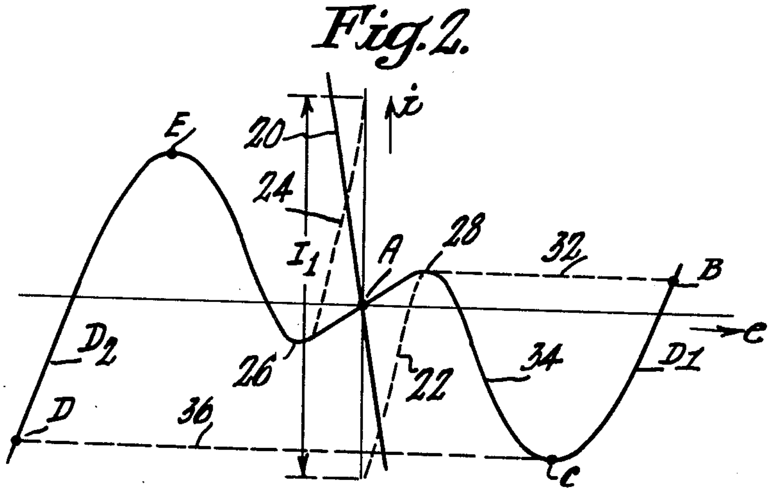
FIGURE 2 is a curve showing the composite current-voltage characteristic of the two tunnel diodes in the circuit of FIGURE 1 under the initial or quiescent conditions.

When viewed from the terminal 10, the two tunnel diodes $D_1$ and $D_2$ have a composite current-voltage characteristic as illustrated in FIGURE 2. Under initial or quiescent conditions, both diodes are in their low voltage states, and a conventional current flows from ground through inductor $L_1$, diode $D_1$ and inductor $L_2$ to the $-V$ terminal. A current also flows from ground through diode $D_2$, and inductor $L_2$ to $-V$. The terminals 14 and 16 may be normally at ground potential. Under quiescent conditions, the currents in the two paths flowing through two diodes are substantially equal. The value of the $-V$ bias potential connected through $L_2$ to the diodes is such as to monostably bias the diodes, i.e., the direct current load line intersects the composite characteristic curve at only one point, as illustrated by line 20 of FIGURE 2.

In FIGURE 2 the dashed line 22 and the solid curve extending to the right thereof represent the individual current-voltage characteristic of diode $D_1$. The dashed line 24 and the solid curve extending to the left thereof represents the individual current-voltage characteristic of the tunnel diode $D_2$. The curve representing the tunnel diode $D_2$ is shown inverted and rotated 180° about the ordinate when compared with the curve representing the diode $D_1$, because the diodes are oppositely poled when viewed from the terminal 10. The composite current-voltage characteristic of both diodes viewed from the terminal 10 includes the curve $D_2$, the solid curve extending from the current peak 26 of curve $D_2$ to the current peak 28 of the diode $D_1$, and the curve $D_1$. The composite characteristic curve intersects the current and voltage axis at the point A, the origin, where the diode and voltage from the point 10 to ground are both zero due to cancellation of equal quantities. The dimension $I_1$ in FIGURE 2 represents the total current from both diodes which flows through the inductor $L_2$. The characteristic curve for diode $D_1$ is shifted down relative to the zero current axis, and the curve for diode $D_2$ is shifted up relative to the constant current axis. This is because both diodes are biased near their current peaks, and since, viewed from terminal 10, these bias points are the same point A, the curves for the diodes $D_1$ and $D_2$ must be appropriately shifted in opposite directions.

The operation of the circuit of FIGURE 1 will now be described starting from the initial or quiescent condition illustrated in FIGURE 2 where the operating point is at the point A which represents zero output current and zero output voltage at the terminal 10. A positive input trigger pulse 12 applied from input terminal 14 through input resistor $R_1$ to the terminal 10 causes an increase in current through the diode $D_1$ because of the direction in which the diode $D_1$ is poled.

The diode $D_2$ is initially unaffected by the input trigger pulse. The input trigger pulse causes the current through the diode $D_1$ to exceed the peak 28 after which the operating point on the composite characteristic rapidly switches along some path schematically indicated as a path 32 to the operating point B wherein the diode $D_1$ is in its high voltage state. The path 32 is a substantially constant current path because the inductors $L_1$ and $L_2$ tend to maintain a constant current flow even though the voltage across the diode $D_1$ increases markedly. Thereafter, the current stored in the inductor $L_1$ and supplied to diode $D_1$ decreases with the result that the operating point moves down from operating point B along the characteristic curve to the operating point C. When the current decreases below the level of operating point C, the negative resistance region 34 of the characteristic is encountered and the operating point switches very rapidly along some path schematically indicated as a path 36 to the operating point D.

The switching from operating point C to operating point D involves the switching of diode $D_1$ from its high voltage state to its low voltage state, and the coincident switching of the diode $D_2$ from its low voltage state to its high voltage state. Diode $D_2$ is switched to the high state because an increased current flows through it which exceeds the peak current of the diode. This results because the current previously flowing from inductor $L_1$ through diode $D_1$ and inductor $L_2$ tends to be maintained by the inductor $L_2$ with the result that current is drawn instead by the inductor $L_2$ from ground through the diode $D_2$. Thereafter, the current drawn by the inductor $L_2$ through the diode $D_2$ decreases with the result that the operating points moves from point D along the characteristic curve to point E.

Figure 3:
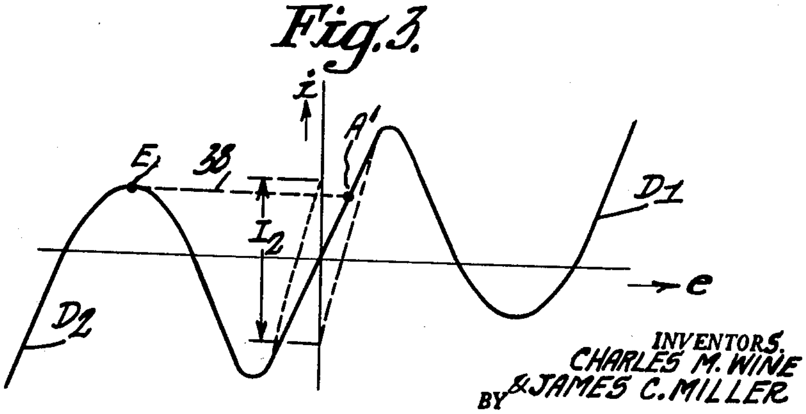
FIGURE 3 is a curve of the composite current-voltage characteristics of the diodes as it exists during a subsequent portion of the operating cycle of the circuit.

Throughout that much of the switching cycle which has thus far been described, the current through the inductor $L_2$ gradually decreases, first because the diode $D_1$ is in the high voltage state and then because the diode $D_2$ is in the high voltage state. This reduction in current through the inductor $L_2$ results in a gradual change in the composite characteristic curve as is illustrated in the curve of FIGURE 3. The portion of the characteristic curve due to diode $D_1$ moves upwardly, and the portion of the characteristic curve due to diode $D_2$ moves downwardly, so that the distance $I_2$ represents a smaller current flowing through $L_2$ compared with the current $I_1$ shown in FIGURE 2. As a consequence, when the reactively supplied current through diode $D_2$ decreases below the value represented by the operating point E, the operating point rapidly switches along a path such as path 38 to the operating point A'. The fact that the low voltage positive resistance region is encountered at the point A' causes the reactive cycle of the circuit to be arrested, whereas it otherwise might continue oscillating if the composite characteristic had remained in its initial form illustrated in FIGURE 2. After the operating point A' in FIGURE 3 is reached, the current through $L_2$ increases and the characteristic curve shown in FIGURE 3 rapidly shifts back to the characteristic shown in FIGURE 2 with the operating point returning to the point A from whence it started.

The bipolar pulse pair output 18 shown in FIGURE 1 carries legends A through A' to indicate the points on the output waveform which correspond in time with the similarly labeled operations points A through A' in FIGURES 2 and 3.

What is claimed is:

1. A circuit comprising first and second tunnel diodes, an inductor, means to apply a bias voltage through said inductor to like electrodes of both of said diodes, a second inductor connected across the series combination of said diodes, means to apply a trigger pulse across the series combination of said diodes, and means to derive an output signal from across the series combination of said diodes.

2. A bipolar pulse pair generator comprising a terminal, a first inductor connected from said terminal to a point of reference potential, two oppositely poled tunnel diodes connected in series from said terminal to said point of reference potential, a second inductor connected at one end to the junction between said tunnel diodes, a source of direct current bias connected to the other end of said second inductor to monostably bias said diodes, means to apply an input trigger pulse to said terminal to initiate a monostable cycle in one of said diodes, whereby said one of the diodes subsequently triggers a monostable cycle in the other diode, and means to derive a resulting bipolar pulse pair output signal from said terminal.

3. A bipolar pulse pair generator comprising a terminal, a first inductor connected from said terminal to a point of reference potential, two oppositely poled tunnel diodes connected in series from said terminal to said point of reference potential, a second inductor connected at one end to the junction between said tunnel diodes, a source of direct current bias connected to the other end of said second inductor to quiescently and monostably bias said diodes in their low voltage states, means to apply an input trigger pulse to said terminal, whereby said diodes are successively triggered to their high voltage states and back again, and means to derive a resulting bipolar pulse pair output signal from said terminal.

4. A bipolar pulse pair generator comprising a terminal, a first inductor connected from said terminal to a point of reference potential, two oppositely poled tunnel diodes connected in series from said terminal to said point of reference potential with their cathodes connected together to form a junction point, a second inductor connected at one end to said junction point, a source of negative direct current bias connected to the other end of said second inductor to quiescently and monostably bias said diodes in their low voltage states, means to apply an input trigger pulse to said terminal, whereby said diodes are successively triggered to their high voltage states and back again, and means to derive a resulting bipolar pulse pair output signal from said terminal.

5. A bipolar pulse pair generator comprising first and second terminals, a first inductor connected across said terminals, two oppositely poled tunnel diodes connected across said terminals, a second inductor connected at one end to the junction between said tunnel diodes, a source of direct current bias connected across the other end of said second inductor and said second terminal, whereby a quiescent bias current flows through said second inductor and through two parallel paths one including one of the diodes and the other including the other diode and the first inductor, means to apply an input trigger pulse across said terminals, whereby one of said diodes is triggered into a monostable cycle which subsequently triggers the other diode into a monostable cycle, and means to derive a resulting bipolar pulse pair output signal from across said terminals.

6. A bipolar pulse pair generator comprising first and second terminals, a first inductor connected across said terminals, two oppositely poled negative resistance diodes connected across said terminals, a second inductor connected at one end to the junction between said diodes, a source of direct current bias connected across the other end of said second inductor and said second terminal, whereby a quiescent bias current flows through said second inductor and through two parallel paths one including one of the diodes and the other including the other diode and the first inductor, means to apply an input trigger pulse across said terminals, and means to derive a resulting bipolar pulse pair output signal from across said terminals.

References Cited in the file of this patent

UNITED STATES PATENTS

| | | |
|---|---|---|
| 2,937,329 | Esche | May 17, 1960 |
| 2,966,599 | Haas | Dec. 27, 1960 |
| 2,975,377 | Price et al. | Mar. 14, 1961 |
| 2,976,429 | Abbott et al. | Mar. 21, 1961 |
| 3,056,048 | McGrogan | Sept. 25, 1962 |
| 3,076,944 | Watters | Feb. 5, 1963 |
| 3,111,593 | Kaenel | Nov. 19, 1963 |